(12) United States Patent
Kardokus et al.

(10) Patent No.: US 9,279,178 B2
(45) Date of Patent: Mar. 8, 2016

(54) MANUFACTURING DESIGN AND PROCESSING METHODS AND APPARATUS FOR SPUTTERING TARGETS

(75) Inventors: Janine K. Kardokus, Veradale, WA (US); Michael Pinter, Spokane, WA (US); Michael D. Payton, Spokane, WA (US); Steven (Chi Tse) Wu, Veradale, WA (US); Jared Akins, Spokane Valley, WA (US); Werner Hort, Cranberry, PA (US)

(73) Assignee: Honeywell International Inc., Morris Plains, NJ (US)

( * ) Notice: Subject to any disclaimer, the term of this patent is extended or adjusted under 35 U.S.C. 154(b) by 1116 days.

(21) Appl. No.: 12/109,816

(22) Filed: Apr. 25, 2008

(65) Prior Publication Data

US 2008/0289958 A1 Nov. 27, 2008

Related U.S. Application Data

(60) Provisional application No. 60/914,455, filed on Apr. 27, 2007.

(51) Int. Cl.
*C22F 1/00* (2006.01)
*C23C 14/34* (2006.01)
*C22F 1/18* (2006.01)

(52) U.S. Cl.
CPC ............. *C23C 14/3414* (2013.01); *C22F 1/18* (2013.01)

(58) Field of Classification Search
USPC .............. 204/192.12, 298.12, 298.13, 640; 205/78, 264; 148/559
See application file for complete search history.

(56) References Cited

U.S. PATENT DOCUMENTS 2,678,909 A * 5/1954 Jernstedt et al. ............. 205/103
4,234,356 A * 11/1980 Auston et al. ................ 438/799
(Continued)

FOREIGN PATENT DOCUMENTS

DE 19925330 A1 * 12/2000
EP 0466617 1/1992
(Continued)

OTHER PUBLICATIONS

Translation to Wollenberg (DE 19925330 A1) published Dec. 2000.*
(Continued)

*Primary Examiner* — John Brayton
(74) *Attorney, Agent, or Firm* — Faegre Baker Daniels LLP

(57) ABSTRACT

Sputtering targets having a reduced burn-in time are disclosed that comprise: a) a heat-modified surface material having a substantially uniform crystallographic orientation, wherein at least part of the surface material was melted during heat-treatment, and b) a core material having an average grain size. Sputtering targets are also disclosed that include a heat-modified surface material having network of shallow trenches, alternating rounded peaks and valleys in the surface of the target or a combination thereof, wherein at least part of the surface material was melted during heat-treatment, and a core material having an average grain size. Methods of producing sputtering targets having reduced burn-in times comprises: a) providing a sputtering target comprising a sputtering surface having a sputter material and a crystal lattice, and b) heat-modifying the sputtering surface in order to melt at least part of the surface material and modify the crystal lattice. Methods of producing a sputtering target having a reduced burn-in time are also disclosed comprising: providing a sputtering target having a sputtering surface, wherein the sputtering surface comprises a damage layer, and modifying the sputtering surface by deplating a layer of material, pulsed-plating a layer of material or a combination thereof.

21 Claims, 14 Drawing Sheets

(56) References Cited

U.S. PATENT DOCUMENTS

| | | | |
|---|---|---|---|
| 4,398,966 A * | 8/1983 | Kelly et al. .................. | 148/512 |
| 4,816,128 A | 3/1989 | Wada et al. | |
| 5,071,800 A | 12/1991 | Iwamoto et al. | |
| 5,151,135 A | 9/1992 | Magee et al. | |
| 5,160,388 A | 11/1992 | Legresy et al. | |
| 5,294,321 A | 3/1994 | Satou et al. | |
| 5,334,267 A | 8/1994 | Taniguchi et al. | |
| 5,418,071 A | 5/1995 | Satou et al. | |
| 5,456,815 A | 10/1995 | Fukuyo et al. | |
| 5,630,918 A | 5/1997 | Takahara et al. | |
| 5,632,869 A | 5/1997 | Hurwitt et al. | |
| 5,726,524 A | 3/1998 | Debe | |
| 5,772,860 A | 6/1998 | Sawada et al. | |
| 5,798,005 A | 8/1998 | Murata et al. | |
| 5,807,443 A | 9/1998 | Masuda et al. | |
| 5,821,175 A | 10/1998 | Engelsberg | |
| 5,997,704 A | 12/1999 | Shiono et al. | |
| 6,001,227 A | 12/1999 | Pavate et al. | |
| 6,024,852 A | 2/2000 | Tamura et al. | |
| 6,030,514 A | 2/2000 | Dunlop et al. | |
| 6,056,857 A | 5/2000 | Hunt et al. | |
| 6,139,701 A | 10/2000 | Pavate et al. | |
| 6,153,315 A | 11/2000 | Yamakoshi et al. | |
| 6,165,607 A | 12/2000 | Yamanobe et al. | |
| 6,228,186 B1 | 5/2001 | Pavate et al. | |
| 6,284,111 B1 | 9/2001 | Takahashi et al. | |
| 6,309,556 B1 | 10/2001 | Joyce et al. | |
| 6,331,233 B1 | 12/2001 | Turner et al. | |
| 6,348,139 B1 | 2/2002 | Shah et al. | |
| 6,451,135 B1 | 9/2002 | Takahashi et al. | |
| 6,454,877 B1 | 9/2002 | Kumar et al. | |
| 6,585,870 B1 | 7/2003 | Pitcher et al. | |
| 6,770,154 B2 | 8/2004 | Koenigsmann et al. | |
| 7,150,810 B2 * | 12/2006 | Hasegawa ................ | 204/192.17 |
| 7,504,008 B2 * | 3/2009 | Doan et al. ............... | 204/192.38 |
| 7,592,563 B2 * | 9/2009 | Wissenbach et al. .... | 219/121.17 |
| 7,651,658 B2 | 1/2010 | Aimone et al. | |
| 7,843,010 B2 * | 11/2010 | Kimura et al. ................ | 257/357 |
| 7,951,275 B2 * | 5/2011 | Tsukamoto .............. | 204/298.12 |
| 2004/0222088 A1 * | 11/2004 | Subramani et al. ...... | 204/298.12 |
| 2005/0040030 A1 | 2/2005 | McDonald | |
| 2005/0142021 A1 | 6/2005 | Aimone et al. | |
| 2005/0279637 A1 * | 12/2005 | Pinter et al. ..................... | 205/78 |
| 2006/0032735 A1 * | 2/2006 | Aimone et al. ............ | 204/192.1 |
| 2007/0051623 A1 | 3/2007 | Hansen et al. | |
| 2007/0215463 A1 | 9/2007 | Parkhe | |
| 2008/0110746 A1 | 5/2008 | Kardokus et al. | |
| 2008/0271779 A1 | 11/2008 | Miller et al. | |

FOREIGN PATENT DOCUMENTS

| | | | |
|---|---|---|---|
| EP | 1018566 | | 7/2000 |
| JP | 60215761 A | * | 10/1985 |
| JP | 02-054765 | | 2/1990 |
| JP | 04-263069 | | 9/1992 |
| JP | 05-148638 | | 6/1993 |
| JP | 05-214520 | | 8/1993 |
| JP | 06-136523 | | 5/1994 |
| JP | 06-136524 | | 5/1994 |
| JP | 06-207267 | | 7/1994 |
| JP | 06-228745 | | 8/1994 |
| JP | 06-228747 | | 8/1994 |
| JP | 07-243036 | | 9/1995 |
| JP | 08-003736 | | 1/1996 |
| JP | 08-100255 | | 4/1996 |
| JP | 08-144052 | | 6/1996 |
| JP | 08302462 A | * | 11/1996 |
| JP | 09-104973 | | 4/1997 |
| JP | 09-287072 | | 11/1997 |
| JP | 10-081960 | | 3/1998 |
| WO | WO 9514307 | | 5/1995 |
| WO | 0013917 B1 | | 3/2000 |
| WO | 02/96636 A1 | | 5/2002 |
| WO | 02/066699 A | | 8/2002 |
| WO | 02/091395 A1 | | 11/2002 |

OTHER PUBLICATIONS

Machine Translation to Mori (JP 08-302462) published Nov. 1996.*

Angelov, Ch et al., "Effects of high dose Bi+ implantation on Si: An atomic force and transmission electron microscopy study", Vacuum, vol. 51, Issue 2, Oct. 1998, pp. 285-288, (abstract only).

Behner, H., "Reoxidation of silicon substrates during the sputter deposition of oxidic thin films", Solid State Communication, 83:9, Sep. 1992, pp. 685-688 (abstract only).

Doughty, C. et al., "Hard boron-suboxide-based films deposited in a sputter-sourced, high-density plasma deposition system", Journal of Vacuum Science & Technology, Sep. 1997, 15:5, pp. 2623-2626 (abstract only).

International Search Report and Written Opinion issued in PCT/US2007/083903, mailed Jan. 30, 2009.

International Search Report and Written Opinion issued in PCT/US2008/061583, mailed Jan. 29, 2009.

Kay, E., et al., "Effect of energetic neutralized noble gas ions on the structure of ion beam sputtered thin metal films", Journal of Vacuum Science & Technology, 5:1, Jan. 1987, pp. 44-51 (abstract only).

Kustner, M. et al., "The influence of surface roughness on the angular dependence of the sputter yield", Nuclear instruments and Methods in Physics Research Section B: Beam Interactions with Materials and Atoms, vol. 145, Issue 3, Nov. 1998, pp. 320-331 (abstract only).

Minami, T. et al., "Physics of very thin ITO conducting films with high transparency prepared by DC magnetron sputtering", Thin Solid Films, vol. 270, Issues 1-2, Dec. 1, 1995, pp. 37-42 (abstract only).

Saito, T.T. et al., "Performance Characteristics of Single Point Diamond Machined Metal Mirrors for Infrared Laser Applications", Applied Optics, 11/74, vol. 13, No. 11, 2647-2650.

Schwyn, S. et al., "Waveguiding epitaxial $LiNbO_3$ layers deposited by radio frequency sputtering", J. Appl. Phys. 72(3), Aug. 1, 1992, pp. 1154-1159.

Selinder, T.I. et al., "The dc magnetron sputter deposition process of $YBa_2Cu_3O_x$ thin films", Physica C: Superconductivity, vols. 162-164, Part 1, Dec. 1989, pp. 599-600 (abstract only).

Shah, S.I., et al., Growth and properties of $YBa_2Cu_3O_{7-x}$, superconducting thin films, Thin Solid Films, vol. 166, Dec. 1, 1988, pp. 171-180 (abstract only).

Yang, YiFeng et al., "Effects of target presputtering on stoichiometry of sputtered Bi—Sr—Ca—Cu—O thin films", Journal of Vacuum Science & Technology, Sep. 1992, 10:5, pp. 3288-3291 (abstract only).

* cited by examiner

Edge sample

Mid-Radial sample

Center sample

MANUFACTURING DESIGN AND PROCESSING METHODS AND APPARATUS FOR SPUTTERING TARGETS

This United States Utility Application has a priority date of Apr. 27, 2007 based on U.S. Provisional Application Ser. No. 60/914,455, and is related to U.S. Ser. No. 11/595,658 filed on Nov. 9, 2006, both of which are incorporated herein in their entirety by reference.

FIELD OF THE SUBJECT MATTER

The field of the invention is manufacturing design and processing methods and apparatus for producing sputtering targets having a reduced burn-in time.

BACKGROUND

Electronic and semiconductor components are used in ever increasing numbers of consumer and commercial electronic products, communications products and data-exchange products. As the demand for consumer and commercial electronics increases, there is also a demand for those same products to become smaller and more portable for the consumers and businesses.

As a result of the size decrease in these products, the components that comprise the products must also become smaller and/or thinner. Examples of some of those components that need to be reduced in size or scaled down are microelectronic chip interconnections, semiconductor chip components, resistors, capacitors, printed circuit or wiring boards, wiring, keyboards, touch pads, and chip packaging.

When electronic and semiconductor components are reduced in size or scaled down, any defects that are present in the larger components are going to be exaggerated in the scaled down components. Thus, the defects that are present or could be present in the larger component should be identified and corrected, if possible, before the component is scaled down for the smaller electronic products.

In order to identify and correct defects in electronic, semiconductor and communications components, the components, the materials used and the manufacturing processes for making those components should be broken down and analyzed. Electronic, semiconductor and communication/data-exchange components are composed, in some cases, of layers of materials, such as metals, metal alloys, ceramics, inorganic materials, polymers, or organometallic materials. The layers of materials are often thin (on the order of less than a few tens of angstroms in thickness). In order to improve on the quality of the layers of materials, the process of forming the layer—such as physical vapor deposition of a metal or other compound—should be evaluated and, if possible, improved.

In addition to improving the quality of the layers of materials that are deposited or applied to surfaces, users also want to improve the length of time components, such as sputtering targets, can be used before their effective lifetime diminishes. In other words, users are looking to get the most out of starting materials, such as those found on a sputtering target, in order to decrease costs and maintenance time.

In a typical vapor deposition process, such as physical vapor deposition (PVD), a sample or target is bombarded with an energy source such as a plasma, laser or ion beam, until atoms are released into the surrounding atmosphere. The atoms that are released from the sputtering target travel towards the surface of a substrate (typically a silicon wafer) and coat the surface forming a thin film or layer of a material. Atoms are released from the sputtering target 10 and travel on an ion/atom path 30 towards the wafer or substrate 20, where they are deposited in a layer.

When a sputtering target is initially utilized, there is a period of time called the "burn-in time" where the surface of the target is "cleaned" of any contaminants or surface deformities in order to produce stable films on surfaces. This burn-in time is usually measured in kilowatt hours. Depending on the method of manufacturing and finishing the sputtering targets, burn-in time can be severely impacted because of surface imperfections and debris. One of the problems with a long burn-in time is that this extended time impacts productivity and overall cost of ownership of the sputtering targets.

U.S. Pat. No. 6,030,514 issued to Dunlop et al. addresses the extended burn-in time problem by utilizing non-mechanical methods to clean and polish the surface of targets before covering the target with a metal enclosure and optionally a passivating barrier layer. The metallic enclosure is designed to help reduce the burn-in time, along with the method of cleaning step. The metallic enclosure or metal layer is an additional step in the process, which can add cost and production time to the product. In this patent, the methods of laser ablation and chemical etching are utilized to remove surface contaminants or bulk material from the surface; however, a portion of the surface is removed during either or both treatments. It would be desirable to merely reduce the overall crystallographic mis-orientation of the surface through annealing and to create the fine network of rounded peaks and valleys that cause burn-in to occur at a faster rate than normal without changing the weight of target.

U.S. Pat. No. 6,153,315 discloses methods of polishing and etching the target surface to reduce burn-in, but this patent cites minimization of the surface roughness as a critical aspect of the invention. In reality, surface roughness alone has nothing to do with the sputter performance of the target, since a fully burned-in target will have a very high surface roughness on the order of the average grain size of the target. The disclosure suggests that the surface roughness needs to be less than 1 micron Ra. In reality, the target should perform well with a surface roughness as high at 50 microns Ra (assuming a nominal 50 micron grain size), as long as the surface protuberances are not sharp enough to introduce arcing.

U.S. Pat. No. 6,284,111 is similar to U.S. Pat. No. 6,153,315, but claims a surface roughness range of 0.4 to 4 microns. The target with the surface described in this patent can potentially work to reduce burn-in, but only if combined with a method such as that disclosed in U.S. Pat. No. 6,331,233 where the bulk of the target has a uniform texture. Targets containing bands of strong preferred orientation can still exhibit very long burn-in times, sometimes up to one fifth of the total target life, even if the surface of the target is free of crystallographic damage.

U.S. Pat. No. 5,632,869 discloses the use of a pre-texturizing method such as machining a grooved pattern into the surface of the target in order to artificially roughen the target surface to mimic the high roughness of a sputtered surface, modify the electric field lines and draw the plasma closer to the surface to increase the sputter rate. Unfortunately, by machining grooves into the target surface, the machining action will propagate crystallographic damage deeper below the surface of the target than flat machining would do. Distortion of the crystal lattice can be more than 3 times the depth of the machine cut. A depth of 0.05 millimeters, as disclosed in the patent can mean an increased sub-surface damage depth of 150 microns or 0.15 mm (generally, three times the depth) or more, which can have the effect of actually prolonging burn-in time rather than reducing it. Chemical etching alone would not distort the crystal lattice, but achieving the cited roughening action through chemical etching would likely require an etch chemistry harsh enough to cause deep pitting, which would result in sharp edges on the target surface and in turn encourage arcing and subsequent particle generation.

U.S. Patent Publication 2005/0040030 also discusses reducing the burn-in time of a target by dry treating the sputtering target using a sputtering ion plasma, however, this publication reduces the burn-in time of the target in a vacuum chamber, as opposed to pre-treating the surface material. The utilization of a vacuum chamber can add costs and maintenance time to the production of the target.

U.S. Patent Publication 2007/0215463 discloses similar subject matter to the other patents and patent applications described herein—and that is utilizing a pre-conditioning method to remove part of the sputtering target surface, but there is no discussion regarding heat-treating the surface material in order to melt it and thereby affect the crystallographic orientation without removing material from the surface. As a matter of fact, this publication discloses annealing the surface of a target, and suggests that the temperature ranges from 400-1000° C., however, this process is in no way designed to melt the surface material of the target, because it is significantly lower than the melting point of many desirable materials, such as tantalum, which has a melting point above 2000° C.

To this end, it would be desirable to produce a sputtering target that a) can be produced with a minimal amount of residual surface damage, b) can be produced to minimize burn-in times by at least 10% as compared to conventional sputtering targets, c) can be produced to minimize surface and near surface distortions of the crystallographic orientation, d) can be produced with a uniform, band-free crystallographic orientation, and e) can be produced efficiently.

SUMMARY OF THE SUBJECT MATTER

Sputtering targets having a reduced burn-in time are disclosed that comprise: a) a heat-modified surface material having a substantially uniform crystallographic orientation, wherein at least part of the surface material was melted during heat-treatment, and b) a core material having an average grain size.

Sputtering targets are also disclosed that include a heat-modified surface material having network of shallow trenches, alternating rounded peaks and valleys in the surface of the target or a combination thereof, wherein at least part of the surface material was melted during heat-treatment, and a core material having an average grain size.

Methods of producing sputtering targets having reduced burn-in times comprises: a) providing a sputtering target comprising a sputtering surface having a sputter material and a crystal lattice, and b) heat-modifying the sputtering surface in order to melt at least part of the surface material and modify the crystal lattice.

Methods of producing a sputtering target having a reduced burn-in time are also disclosed comprising: providing a sputtering target having a sputtering surface, wherein the sputtering surface comprises a damage layer, and modifying the sputtering surface by deplating a layer of material, pulsed-plating a layer of material or a combination thereof.

Table 1 shows a set of contemplated conditions for laser treatment of sputtering target surfaces.

Figure 5:
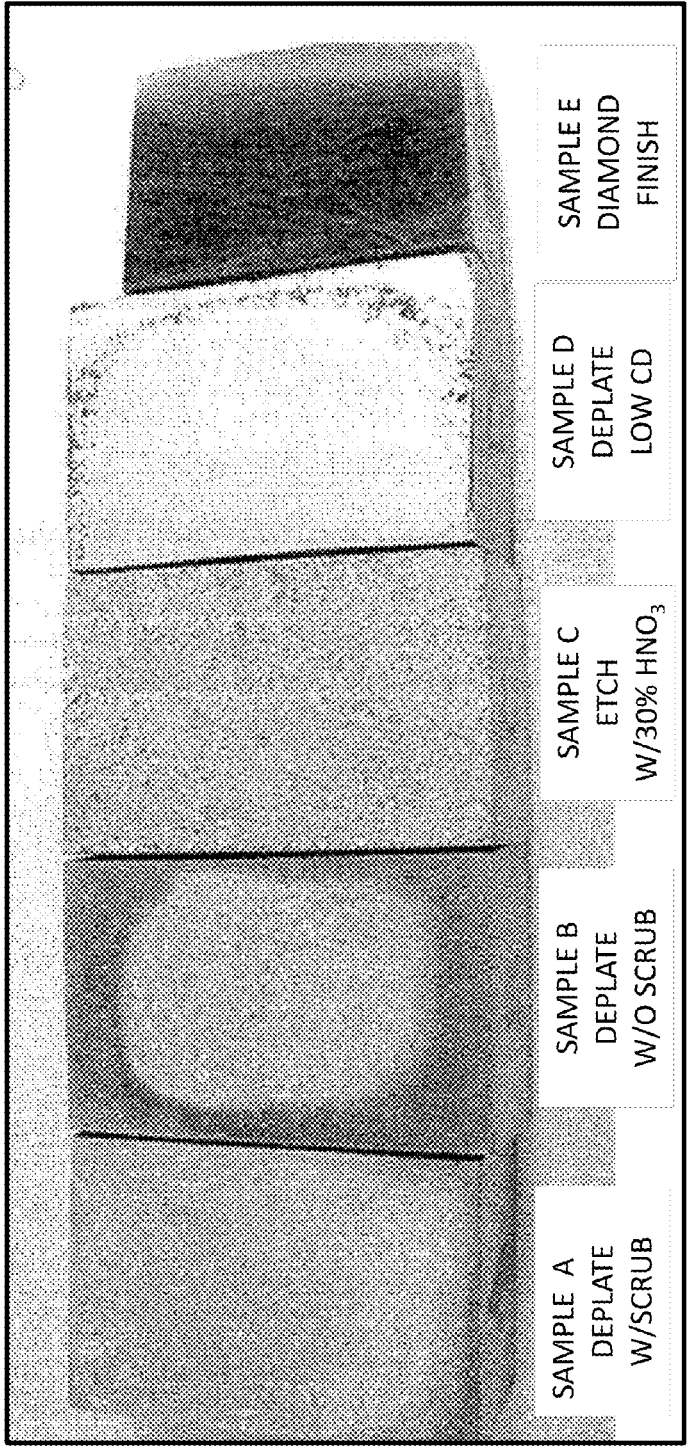

FIG. 5 and Table 2 shows several samples—some for comparison purposes and some contemplated. Samples A, B and D were deplated and Sample C was etched.

Figure 6A:
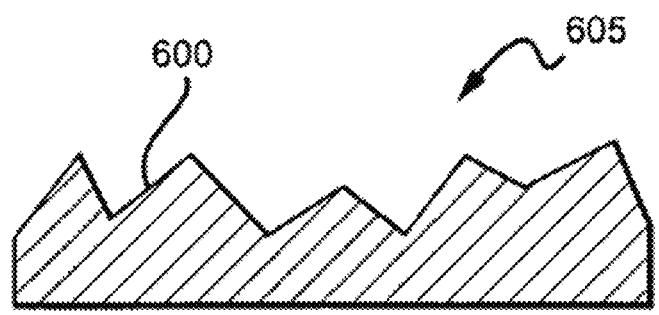
Figure 6B:
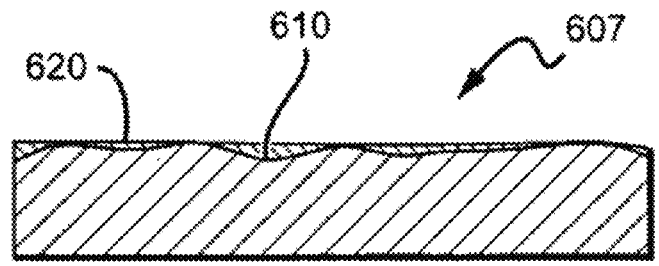

FIGS. 6A and 6B show the schematic of an as-machined surface (600) of a sputtering target (605) and of a polished surface (610) of a sputtering target (607) with a residual surface damage layer (620).

Figure 7:
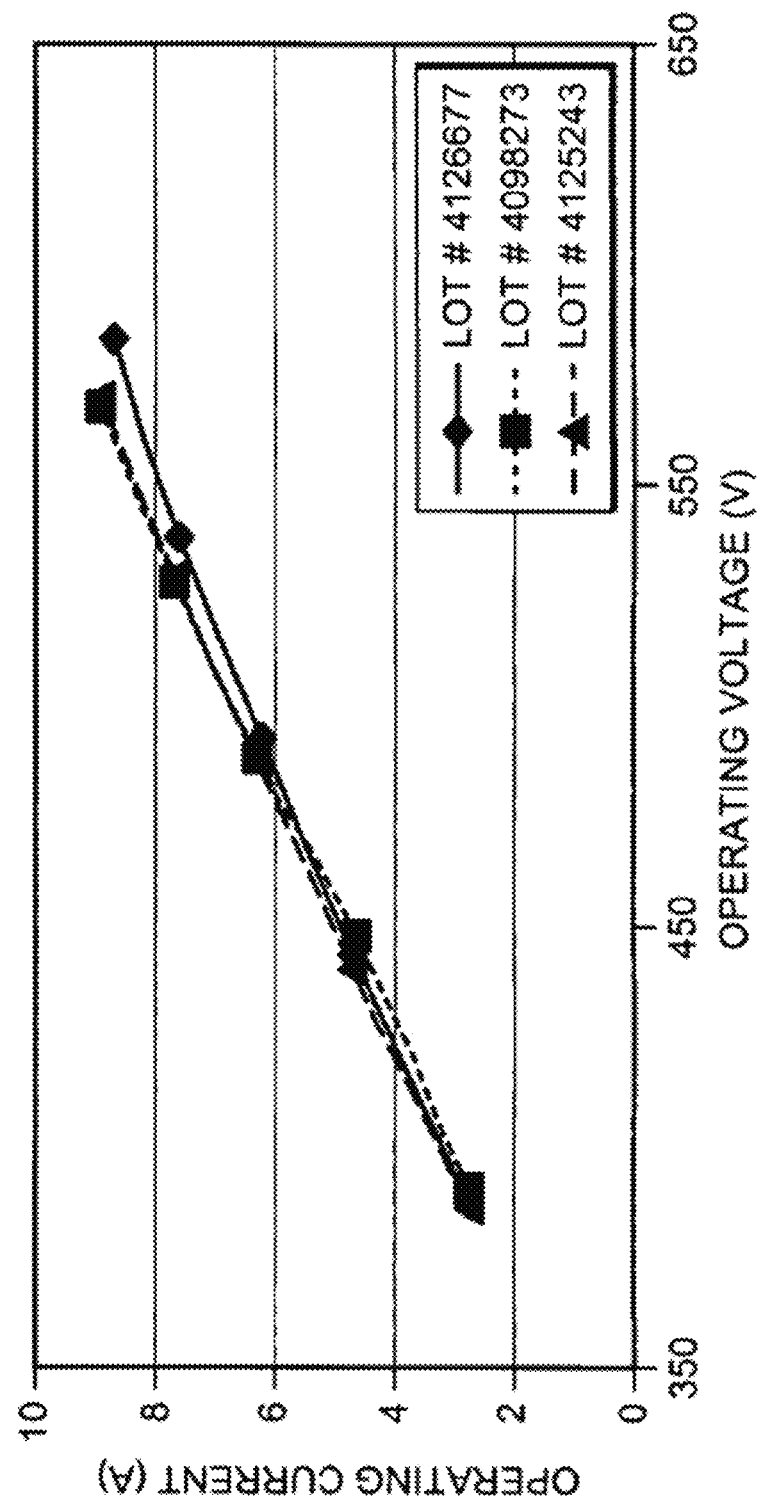

FIG. 7 shows a graph with "I-V" curves, where operating current (A) and operating voltage (V) are represented on the graph. The targets with as-machined 16 Ra (Lot 4098273) and 27 Ra (Lot 4125243) show virtually identical I-V curves. The target with polished 7 Ra standard finish (Lot 4126677) operated at a slightly higher voltage, potentially because of the residual resistive damage layer.

Figure 8:
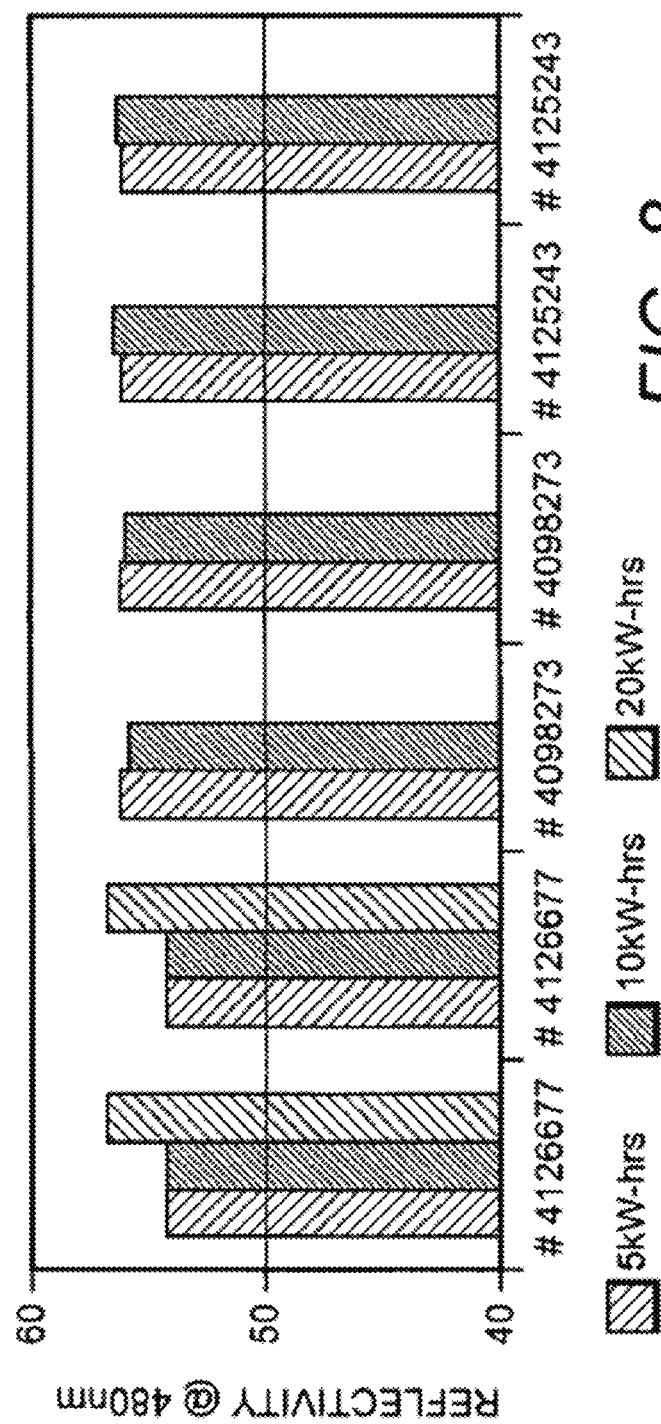

FIG. 8 shows a bar graph of tantalum film reflectivity data, specifically reflectivity at 480 nm for each of the three targets mentioned above over 5 kW-hours, 10 kW-hours and 20 kW-hours. The film reflectivity of the standard finish polished target (7 Ra) was initially lower than those of the as-machined targets. The reflectivity of the polished standard target recovered after about 4 times longer burn-in or 20 kW-hours. The as-machined surfaces appear to have less of a residual surface damage layer.

Figure 9:
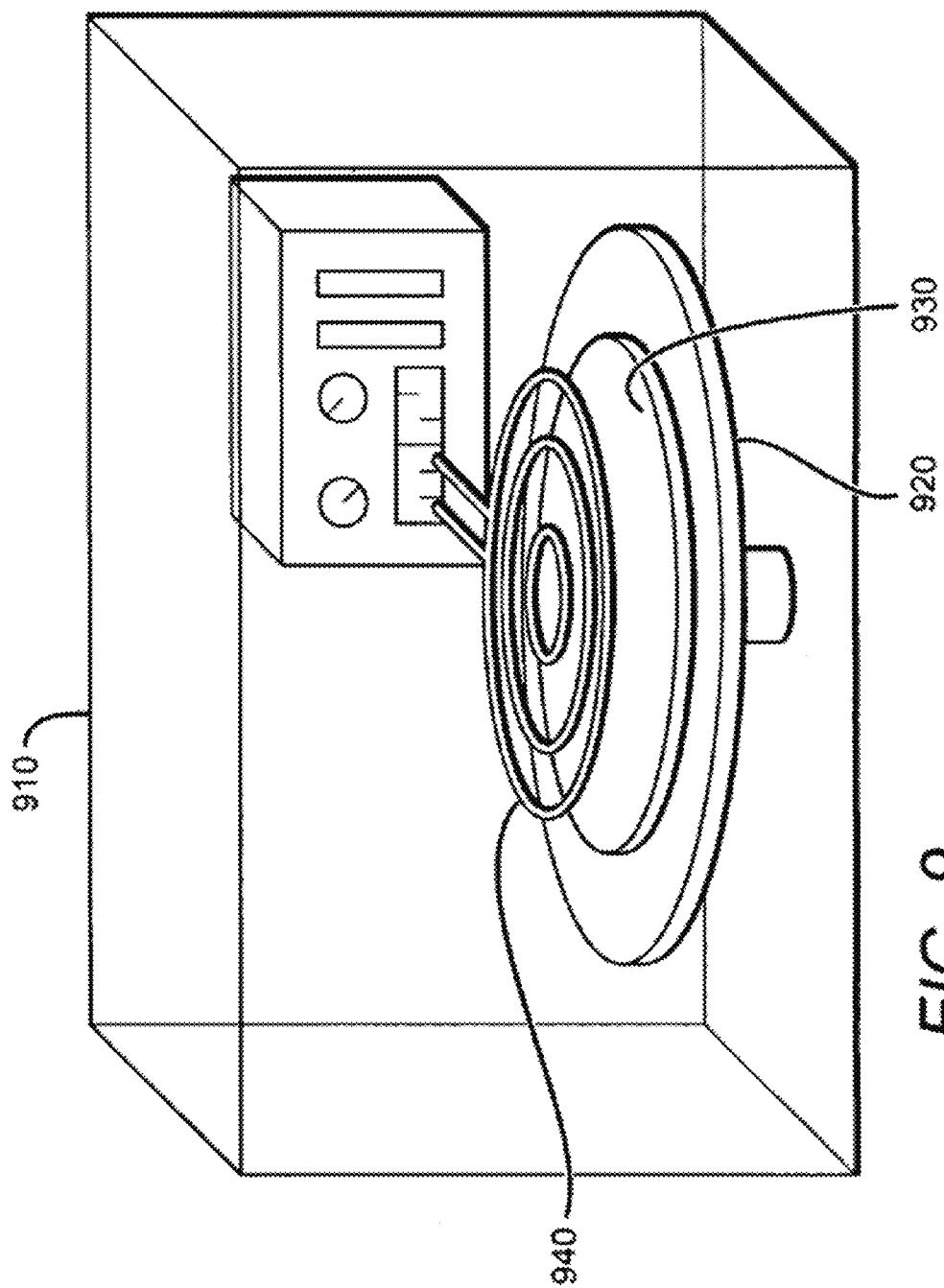

FIG. 9 shows a turn table-type of arrangement 920 in an atmospheric controlled environment (glove box—910).

Figure 10:
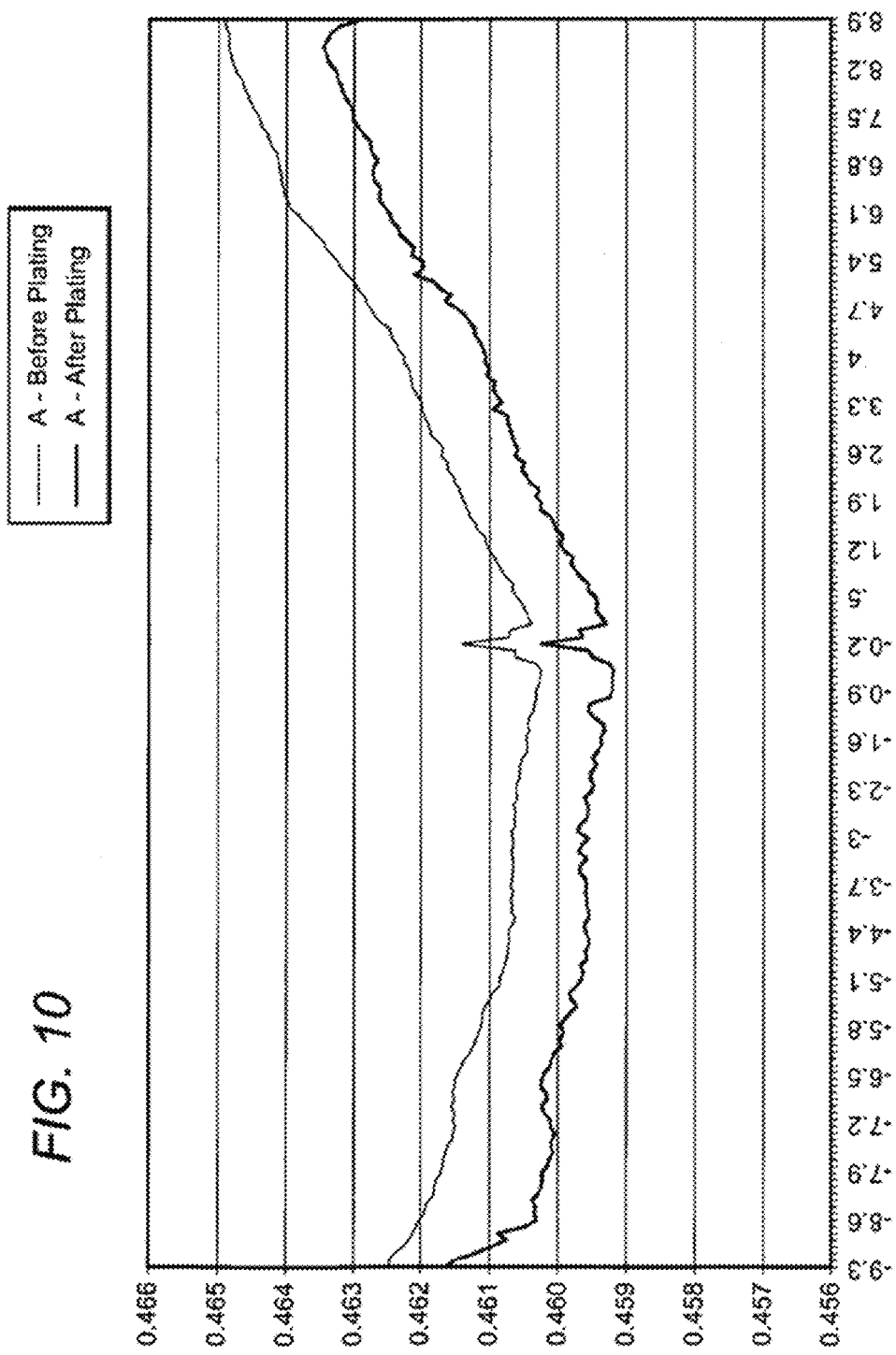

FIG. 10 illustrates the uniform removal of approximately 40 microns of copper across the target diameter.

Figure 11:
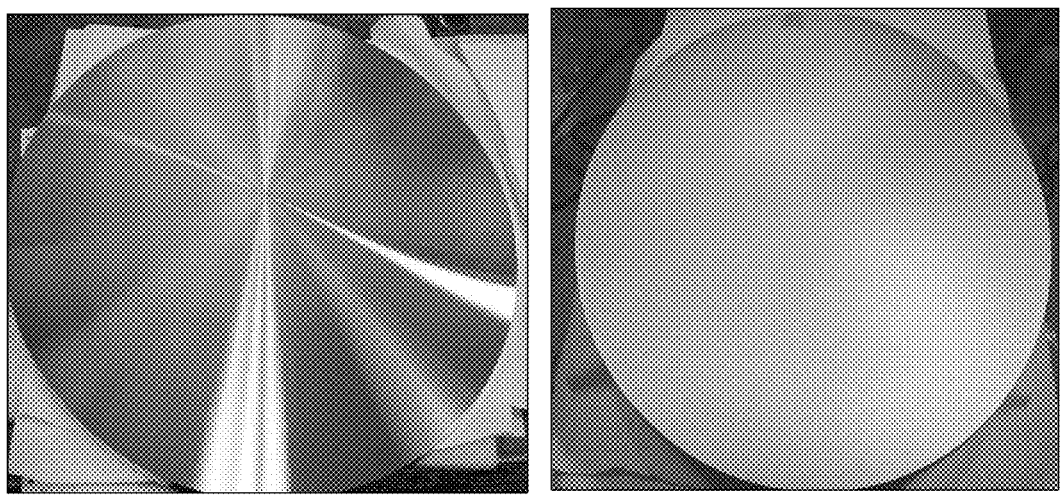

FIG. 11 shows a target surface after uniform removal of approximately 40 microns of copper across the diameter. The target surface exhibits a "grainy" appearance reflective of the exposed copper microstructure having a surface roughness of approximately 40 microinches ($R_a$).

Figure 12:
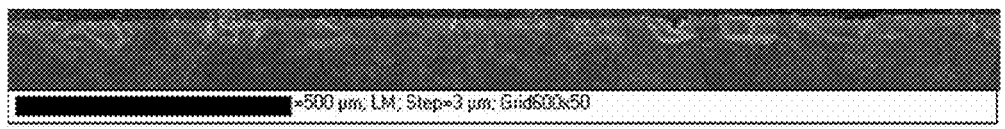
Figure 12:
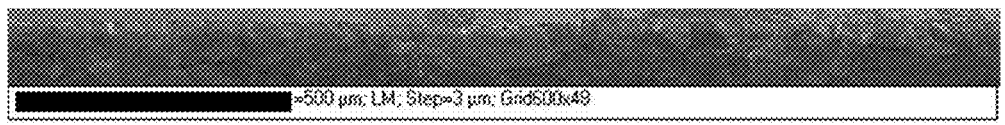
Figure 12:

FIG. 12 shows EBSD misoriention plots (edge sample, mid-radial sample and center sample) that show the absence of sub-surface damage.

Figures 13A, 13B:
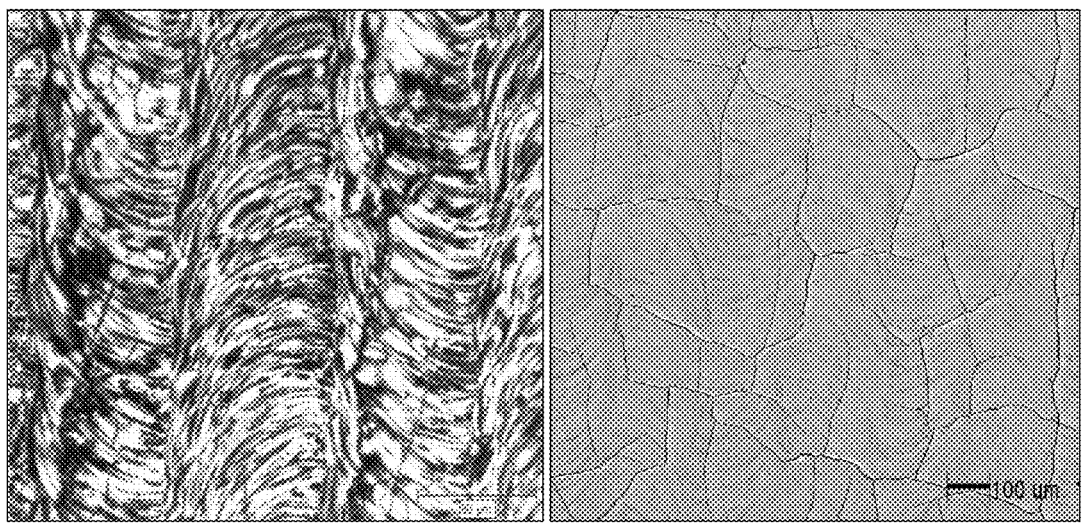

FIGS. 13A and 13B show the appearance of micro-cracks in a contemplated surface. FIG. 13A shows a laser treated surface at 200× magnification using an optical microscope. Note that there are laser trace marks and fine surface cracks. FIG. 13B shows a laser treated surface using SEM in back-scattered mode. The fine surface cracks are shown.

Figure 14:
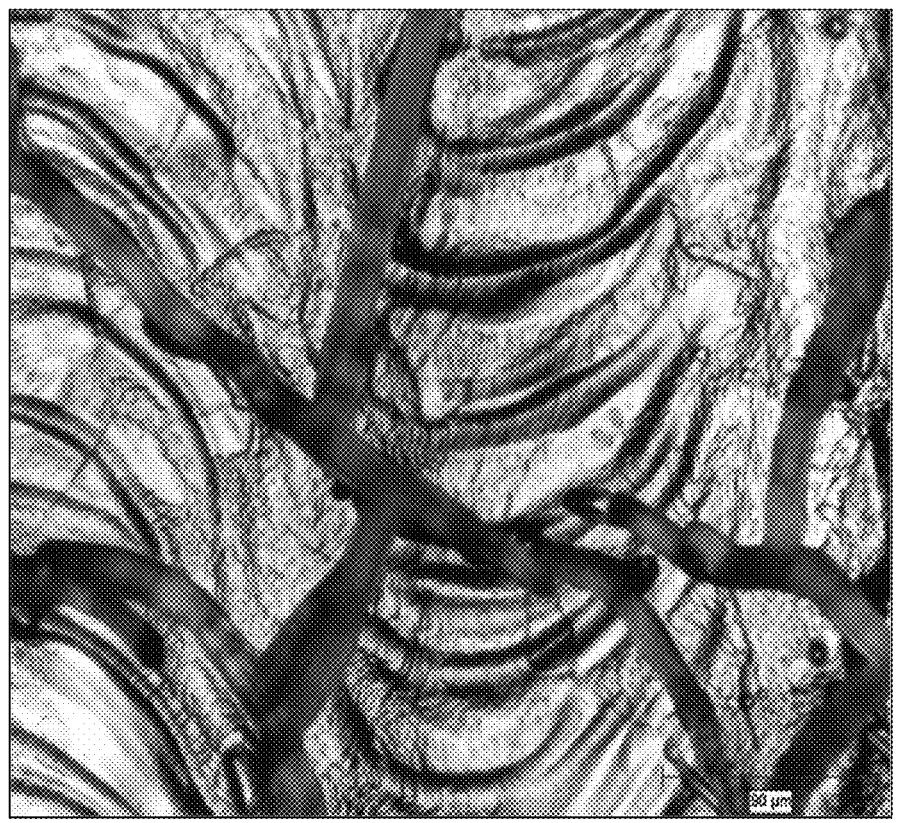

FIG. 14 shows the appearance of a contemplated surface after chemical etching. In this Figure, the surface has been laser-treated and then etched using a 30% $HNO_3$/15% HF solution for 20 minutes, where about 13 micrometers of Ta was removed. As one can see, the cracks have widened to grooves.

DESCRIPTION OF THE SUBJECT MATTER

A sputtering target has been produced that achieves at least one of the following goals: a) can be produced with a minimal amount of residual surface damage, b) can be produced to minimize burn-in times by at least 10% as compared to conventional sputtering targets, c) can be produced to minimize surface and near surface distortions of the crystallographic orientation, d) can be produced with a uniform, band-free crystallographic orientation, e) can be surface-modified utilizing heat treatment, and f) can be produced efficiently. In addition, methods and apparatus have been discovered that can successfully identify the thickness of the surface layer and the degree of residual surface damage and in turn help to understand the impact of this residual surface damage on the burn-in time of the target.

Specifically, sputtering targets having a reduced burn-in time are disclosed that comprise: a) a heat-modified surface material having a substantially uniform crystallographic orientation, wherein at least part of the surface material was melted during heat-treatment, and b) a core material having an average grain size. The heat-modified surface material results in a surface material that is improved over conventional surface materials, in that dislocations in the crystal lattice are reduced or removed entirely as a function of the heat treatment.

It is instructive to clearly distinguish the current subject matter from the conventional state of the art, as disclosed in the background section. In the case of an annealing treatment, which is disclosed in many of the references discussed in the background section, the energy from a deformation process (in this case machining) drives the re-arrangement of atoms in the lattice once the temperature increase (annealing temperature) crosses the activation energy for the onset of either recovery or re-crystallization. If atom mobility is high enough in the surface material, lattice dislocations can also anneal out without completely melting the material. In the surface material melting case (the present subject matter), the molten material uses the underlying solid crystal structure as a template for solidification, much the way a single crystal seed sets the crystallization behavior of a silicon boule being grown from the melt. The heat-treated material will quickly re-solidify, taking on the crystallographic orientation of the underlying material. The methods utilized to heat-modify the surface material, along with the characteristics of these modified surface materials will be discussed later and in the Examples.

Sputtering targets and sputtering target assemblies contemplated and produced herein comprise any suitable shape and size depending on the application and instrumentation used in the vapor deposition processes. Sputtering targets contemplated and produced herein comprise a surface material having an average grain size and a core material having an average grain size. The surface material and core material may generally comprise the same elemental makeup or chemical composition/component, or the elemental makeup and chemical composition of the surface material may be altered or modified to be different than that of the core material.

Sputtering targets contemplated herein may generally comprise any material that can be a) reliably formed into a sputtering target; b) sputtered from the target when bombarded by an energy source; and c) suitable for forming a final or precursor layer on a wafer or surface. Materials that are contemplated to make suitable sputtering targets are metals, metal alloys, conductive composite materials, dielectric materials, and any other suitable sputtering material. As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include titanium, silicon, cobalt, copper, nickel, iron, zinc, vanadium, zirconium, aluminum and aluminum-based materials, tantalum, niobium, tin, chromium, platinum, palladium, gold, silver, tungsten, molybdenum, cerium, promethium, ruthenium or a combination thereof. More preferred metals include copper, aluminum, tungsten, titanium, cobalt, tantalum, magnesium, lithium, silicon, manganese, iron or a combination thereof. Most preferred metals include copper, aluminum and aluminum-based materials, tungsten, titanium, zirconium, cobalt, tantalum, niobium, ruthenium or a combination thereof. Examples of contemplated and preferred materials, include aluminum and copper for superfine grained aluminum and copper sputtering targets; aluminum, copper, cobalt, tantalum, zirconium, and titanium for use in 200 mm and 300 mm sputtering targets, along with other mm-sized targets; and aluminum for use in aluminum sputtering targets that deposit a thin, high conformal "seed" layer or "blanket" layer of aluminum surface layers. It should be understood that the phrase "and combinations thereof" is herein used to mean that there may be metal impurities in some of the sputtering targets, such as a copper sputtering target with chromium and aluminum impurities, or there may be an intentional combination of metals and other materials that make up the sputtering target, such as those targets comprising alloys, borides, carbides, fluorides, nitrides, silicides, oxides and others.

The term "metal" also includes alloys, metal/metal composites, metal ceramic composites, metal polymer composites, as well as other metal composites. Alloys contemplated herein comprise gold, antimony, arsenic, boron, copper, germanium, nickel, indium, palladium, phosphorus, silicon, cobalt, vanadium, iron, hafnium, titanium, iridium, zirconium, tungsten, silver, platinum, ruthenium, tantalum, tin, zinc, rhenium, and/or rhodium. Specific alloys include gold antimony, gold arsenic, gold boron, gold copper, gold germanium, gold nickel, gold nickel indium, gold palladium, gold phosphorus, gold silicon, gold silver platinum, gold tantalum, gold tin, gold zinc, palladium lithium, palladium manganese, palladium nickel, platinum palladium, palladium rhenium, platinum rhodium, silver arsenic, silver copper, silver gallium, silver gold, silver palladium, silver titanium, titanium zirconium, aluminum copper, aluminum silicon, aluminum silicon copper, aluminum titanium, chromium copper, chromium manganese palladium, chromium manganese platinum, chromium molybdenum, chromium ruthenium, cobalt platinum, cobalt zirconium niobium, cobalt zirconium rhodium, cobalt zirconium tantalum, copper nickel, iron aluminum, iron rhodium, iron tantalum, chromium silicon oxide, chromium vanadium, cobalt chromium, cobalt chromium nickel, cobalt chromium platinum, cobalt chromium tantalum, cobalt chromium tantalum platinum, cobalt iron, cobalt iron boron, cobalt iron chromium, cobalt iron zirconium, cobalt nickel, cobalt nickel chromium, cobalt nickel iron, cobalt nickel hafnium, cobalt niobium hafnium, cobalt niobium iron, cobalt niobium titanium, iron tantalum chromium, manganese iridium, manganese palladium platinum, manganese platinum, manganese rhodium, manganese ruthenium, nickel chromium, nickel chromium silicon, nickel cobalt iron, nickel iron, nickel iron chromium, nickel iron rhodium, nickel iron zirconium, nickel manganese, nickel vanadium, tungsten titanium, tantalum ruthenium, copper manganese, germanium antimony telluride, copper gallium, indium selenide, copper indium selenide and copper indium gallium selenide and/or combinations thereof.

As far as other materials that are contemplated herein for sputtering targets, the following combinations are considered examples of contemplated sputtering targets (although the list is not exhaustive): chromium boride, lanthanum boride, molybdenum boride, niobium boride, tantalum boride, titanium boride, tungsten boride, vanadium boride, zirconium boride, boron carbide, chromium carbide, molybdenum carbide, niobium carbide, silicon carbide, tantalum carbide, titanium carbide, tungsten carbide, vanadium carbide, zirconium carbide, aluminum fluoride, barium fluoride, calcium fluoride, cerium fluoride, cryolite, lithium fluoride, magnesium fluoride, potassium fluoride, rare earth fluorides, sodium fluoride, aluminum nitride, boron nitride, niobium nitride, silicon nitride, tantalum nitride, titanium nitride, vanadium nitride, zirconium nitride, chromium silicide, molybdenum silicide, niobium silicide, tantalum silicide, titanium silicide, tungsten silicide, vanadium silicide, zirconium silicide, aluminum oxide, antimony oxide, barium oxide, barium titanate, bismuth oxide, bismuth titanate, barium strontium titanate, chromium oxide, copper oxide, hafnium oxide, magnesium oxide, molybdenum oxide, niobium pentoxide, rare earth oxides, silicon dioxide, silicon monoxide, strontium oxide, strontium titanate, tantalum pentoxide, tin oxide, indium oxide, indium tin oxide, lanthanum aluminate, lanthanum oxide, lead titanate, lead zirconate, lead zirconate-titanate, titanium aluminide, lithium niobate, titanium oxide, tungsten oxide, yttrium oxide, zinc oxide, zirconium oxide, bismuth telluride, cadmium selenide, cadmium telluride, lead selenide, lead sulfide, lead telluride, molybdenum selenide, molybdenum sulfide, zinc selenide, zinc sulfide, zinc telluride and/or combinations thereof. In some embodiments, contemplated materials include those materials disclosed in U.S. Pat. No. 6,331,233, which is commonly-owned by Honeywell International Inc., and which is incorporated herein in its entirety by reference.

In some embodiments, the surface material comprises a subsurface that can be measured in layers by "grain layers"—meaning each layer is the average thickness of the grains in that layer. In these embodiments, after heat-treatment, the subsurface damage layer is less than five grains deep. In other embodiments, after heat-treatment, the subsurface damage layer is less than four grains deep. In yet other embodiments, after heat-treatment, the subsurface damage layer is less than three grains deep. In other embodiments, after heat-treatment, the subsurface damage layer is less than two grains deep. And in yet other embodiments, after heat-treatment, the subsurface damage layer is less than one grain deep.

The surface material is that portion of the target that is intended to produce atoms and/or molecules that are deposited via vapor deposition to form the surface coating/thin film. This surface material is important because it is this layer of material that directly affects burn-in time, as discussed earlier. Conventional sputtering targets are generally manufactured and finished by sanding or buffing the surface material, and while this process produces a uniform and attractive surface appearance, the process leaves behind a relatively significant amount of residual surface damage and surface particulate/debris. In contemplated embodiments, as discussed herein, sputtering targets are heat-treated in order to remove lattice damage at the surface of the target by melting at least a portion of the surface material of the sputtering target. In some embodiments, the surface of the target is then chemically treated in order to minimize, remove or further shape cracks and/or small imperfections in the surface material.

The phrase "residual surface damage" as used herein refers to that portion of a sputtering target that does not contain material or material configurations that are suitable for desirable sputtered layers. For example, in some embodiments, residual surface damage may be the presence of layers or pockets of crystal grains that are "misoriented" in relation to the crystallographic orientation of the surrounding grains. This condition will result in unstable deposition rates of the sputtered material onto the wafer. For example, there may be surface or near surface distortion of the crystallographic lattice. In other embodiments, residual surface damage may be the presence of layers or pockets of debris, particulate or other materials that are not considered to be suitable sputterable material, such as sand, dust, grit or other materials. In yet other embodiments, residual surface damage may be the presence of layers or pockets of uneven terrain on the sputtering target, which is different from misoriented crystal grains, in that there are portions of the sputtering target itself that are damaged beyond just misoriented crystal grains, and this damage is more significant. In other embodiments, residual surface damage refers to a combination of several of the problems mentioned above. It should be obvious, however, that the degree of residual surface damage can directly impact the burn-in time of the target or the time it takes before the target becomes useful for sputtering acceptable layers of materials on a surface.

Methods of producing sputtering targets having reduced burn-in times comprises: a) providing a sputtering target comprising a sputtering surface having a sputter material and a crystal lattice, and b) heat-modifying the sputtering surface in order to melt at least part of the surface material and modify the crystal lattice. In some embodiments, it is desirable to machine-finish the sputtering surface. In other embodiments, it is suitable to chemically etch the sputtering surface after the heat-modifying step. In some embodiments, heat-modifying the sputtering surface in order to melt at least part of the surface material and modify the crystal lattice includes melting a thin layer of the entire surface material. In some embodiments, as discussed herein, sputtering targets may be initially machine-finished in order to produce a surface material with a lower incidence of residual surface damage. In other embodiments, sputtering targets may be machine-finished to produce a surface material with quantitatively little to no residual surface damage. In contemplated embodiments, as mentioned, average surface roughness (Ra) should be equal to or lower than about the average grain size of the bulk material. In some embodiments, contemplated machine-finished surface materials comprise less than about 64 microinches surface roughness (Ra). In other embodiments, contemplated surface materials comprise less than about 32 microinches surface roughness (Ra). In yet other embodiments, contemplated surface materials comprise less than about 16 microinches surface roughness (Ra).

It has been discovered that sharp surface asperities can be a component of residual surface damage and has a direct correlation to the burn-in times for a sputtering target. Therefore, it is important to ensure that the surface is free of sharp protrusions or edges for all types of targets. Some targets, such as tantalum and copper, present problems when trying to minimize sharp surface asperities. Conventional machining techniques tend to leave cold welds and pull-outs on the surface of the target. The tantalum chips coming off the target during machining bond to the machine insert due to the high heat buildup during machining. This material adhering to the insert gradually changes the cutting angle of the tool, making the cutting angle increasingly unfavorable with respect to achieving a clean cut surface. The tantalum surface can then be ripped by the faulty insert causing a pull-out, or the material adhering to the insert can bond to the tantalum surface, causing a cold weld. Both phenomena can cause sharp points or edges in a localized region on the target surface. These asperities can then be a source of arcing, which at best causes instabilities in the sputtering process, at worst causes particles. A conventional sanding or buffing process is used to remove surface asperities, and while it is successful in producing a uniform product, it leaves particulate or debris deposition on the target—another contributor to residual surface damage and slow burn-in times.

In some embodiments, the machine finishing is accomplished using a carbide insert. In other embodiments, the surface material is machined utilizing electrostatic discharge machining (EDM), electrochemical machining (ECM), cryomachining, CNC lathe and CNC mill, diamond point machining, or a sequence or combination of these processes, including the carbide insert.

Electrical discharge machining (or EDM) is a machining method primarily used for hard metals or those that would be impossible to machine with traditional techniques. One critical limitation, however, is that EDM only works with materials that are electrically conductive. EDM can cut small or odd-shaped angles, intricate contours or cavities in extremely hard steel and exotic metals such as titanium, hastelloy, kovar, inconel and carbide. Sometimes referred to as spark machining or spark eroding, EDM is a nontraditional method of removing material by a series of rapidly recurring electric arcing discharges between an electrode (the cutting tool) and the work piece, in the presence of an energetic electric field. The EDM cutting tool is guided along the desired path very close to the work but it does not touch the piece. Consecutive sparks produce a series of micro-craters on the work piece and remove material along the cutting path by melting and vaporization. The particles are washed away by the continuously flushing dielectric fluid. There are two main types of EDM machines, ram and wire-cut, (see: http://en.wikipedia.org/wiki/Electrical_discharge_machining).

Electrochemical machining (ECM) is based on a controlled anodic electrochemical dissolution process of the workpiece (anode) with the tool (cathode) in an electrolytic cell, during an electrolysis process. Electrochemical Machining (ECM) is similar to electropolishing in that it also is an electrochemical anodic dissolution process in which a direct current with high density and low voltage is passed between a workpiece and a preshaped tool (the cathode). At the anodic workpiece surface, metal is dissolved into metallic ions by the deplating reaction, and thus the tool shape is copied into the workpiece. (see: http://www.unl.edu/nmrc/ECMoutline.htm)

Once the surface is machine-finished to remove residual surface damage, the surface is then heat-modified or heat-treated by melting at least a portion of the surface material. In some embodiments, a substantially uniform crystallographic orientation is produced. As used herein, the term "substantially" with reference to the crystallographic orientation means that the crystallographic orientation is within a few percentage points (less than 10%) of being completely uniform.

Crystallographic orientation of the surface material, core material or a combination thereof is also important to the operation of the sputtering target and to the reduction of burn-in times. Specifically, crystallographic orientation of the materials in the sputtering target is particularly important in those materials where sputter rate/deposition rate is strongly dependent on crystallographic orientation of the grains. As mentioned, two contemplated materials are tantalum and copper. In some contemplated sputtering targets, the target can be produced to minimize surface and near surface distortions of the crystallographic orientation and/or can be produced with a substantially uniform, band-free crystallographic orientation.

In addition, contemplated sputtering targets may be treated by any suitable process, method or device, such as annealing, induction heating, laser treatment, which may be followed by an etch treatment, or a combination thereof, in order to further reduce any residual surface damage. Surface stresses may also be removed by utilizing a suitable thermal treatment, such as laser treatment, e-beam treatment, heat contact treatment, explosive flash treatments, etc. or a deposition treatment, such as plasma spray treatment, or a combination thereof. It should be understood, however, that these methods and techniques are not designed to produce the sputtering targets disclosed herein without the step of melting at least part of the surface material.

One example of a method of recovering or recrystallizing the surface damaged layer of the target is to utilize the process of induction heating. Induction heating treats the thin top surface of the sputtering target metal/material through controlling the application of induction power frequency as applied to this damaged surface. Typically, the damage layer thickness is between about 30 microns and 250 microns, and by controlling the power supply frequency and the design of the induction coil, the thin damage layer on the target surface can be recovered or recrystallized. An example of this process would be the surface hardening of steel. Example 3 below shows a contemplated arrangement for an induction heating device and method. The induction process works well on sputtering targets that comprise copper.

Figure 1:
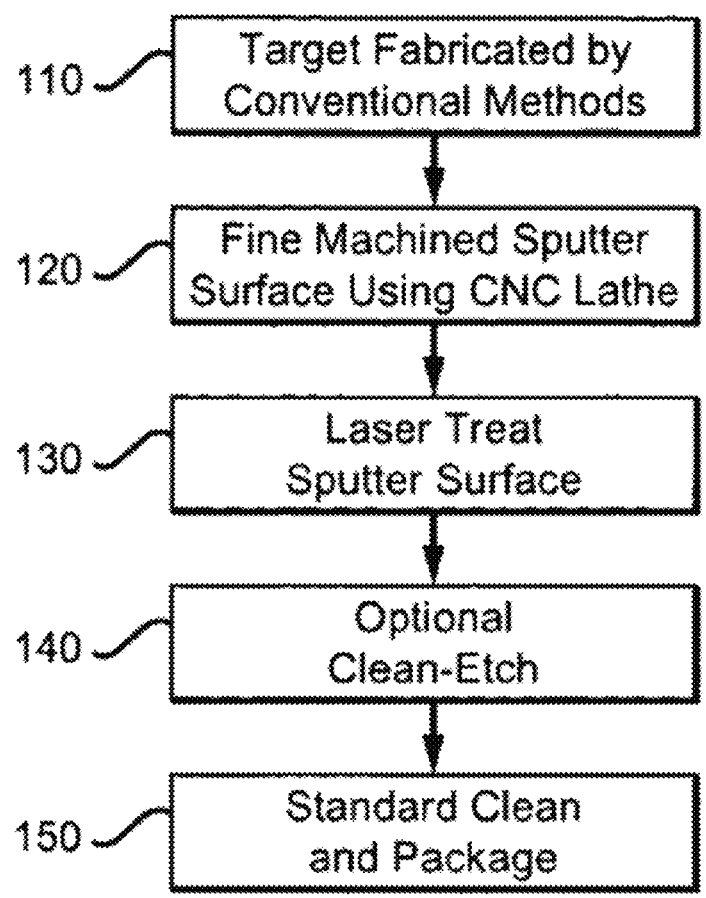
FIG. 1 shows a typical flow chart for the steps involved in a heat treatment process where a heat treatment process, such as a laser surface treatment process, is used.
Figure 2:
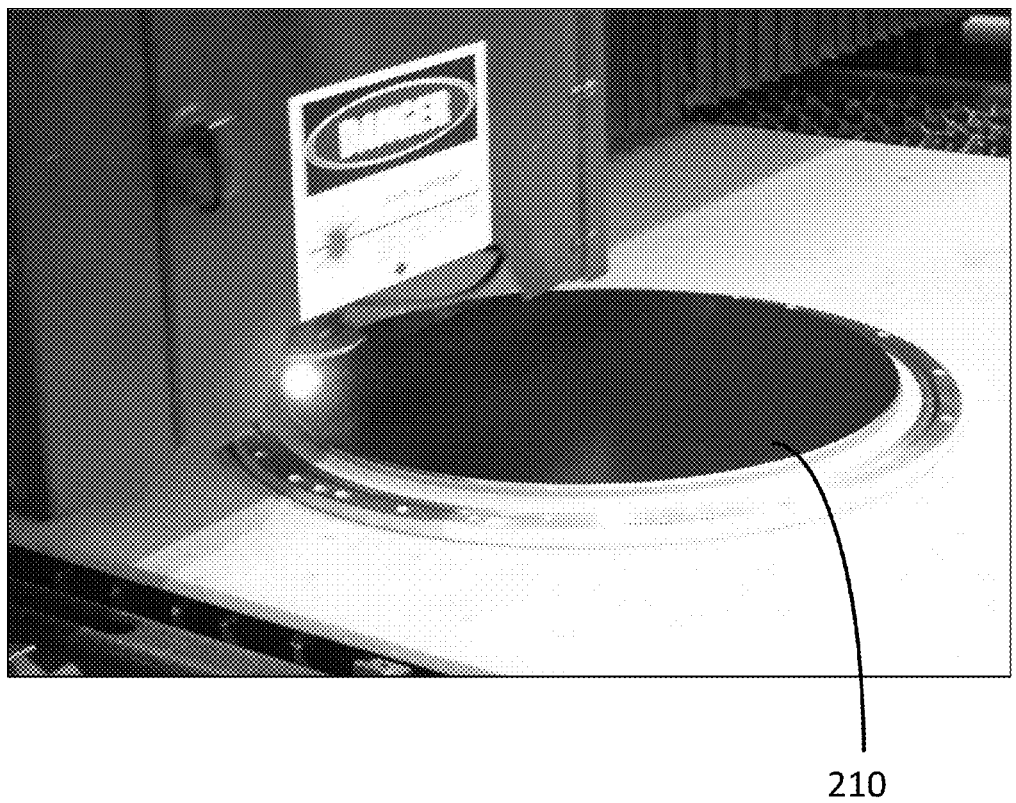
FIGS. 2-4 show actual targets 210, 310 and 410, respectively, that have been subjected to a heat treatment, such as laser surface modification.
Figure 3:
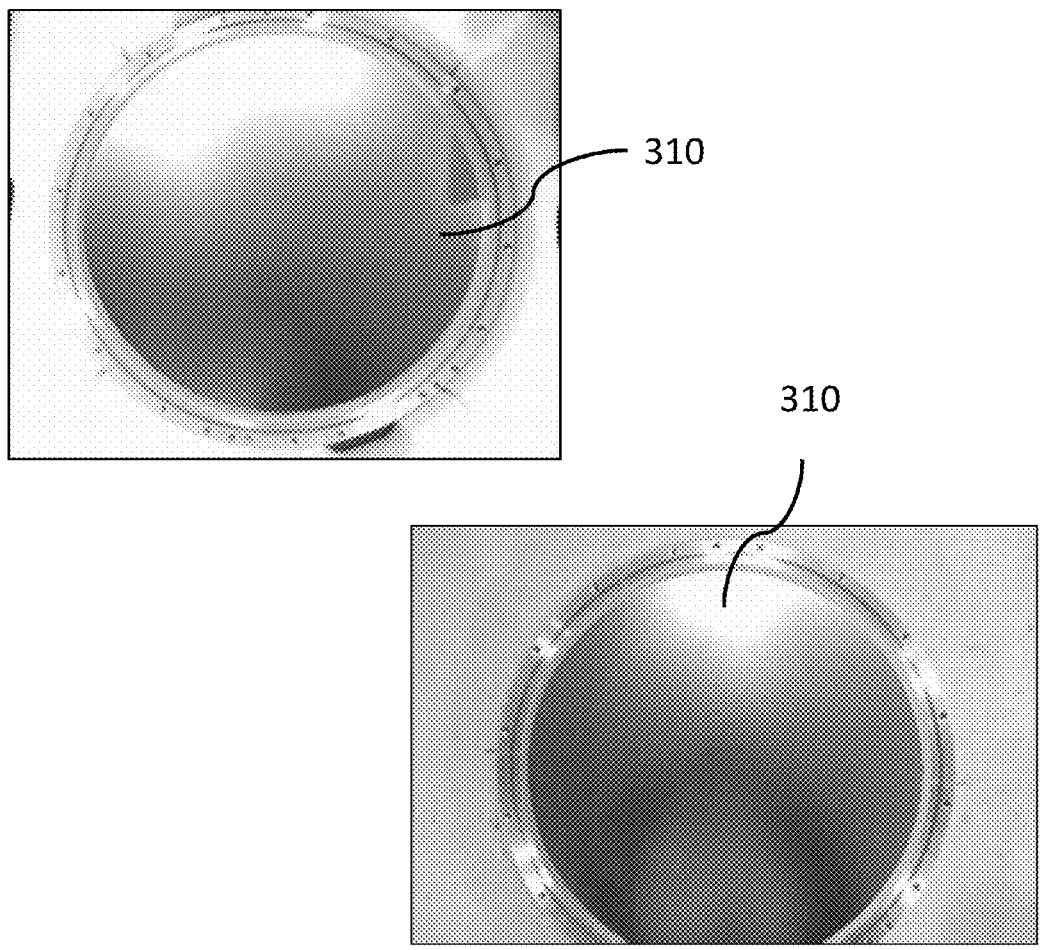
Figure 4:
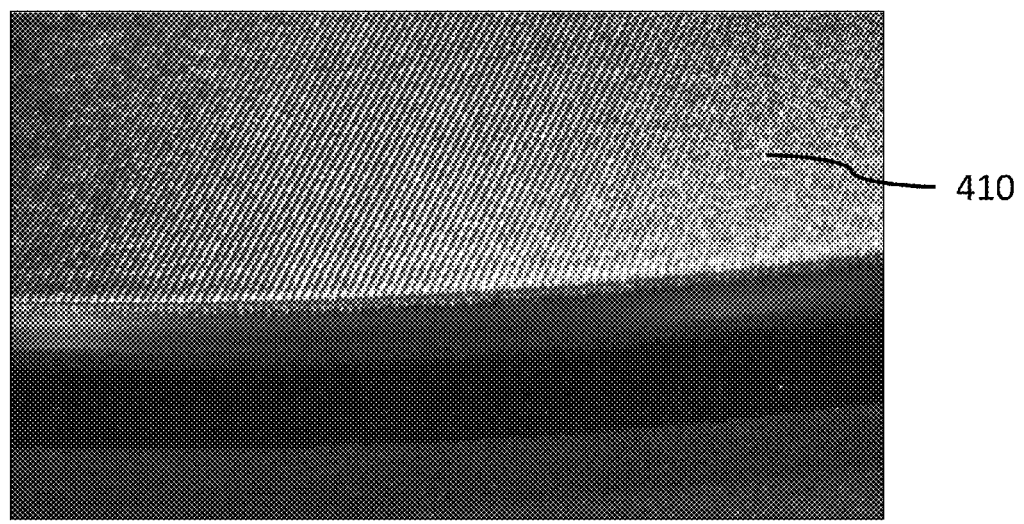

As mentioned, another method of repairing or removing the surface damage of the target is by applying a heat treatment, such as a laser treatment, laser annealing or by utilizing another concentrated heat source on the top of the sputtering target up to about 250 microns deep in the target, and in some embodiments, on the top of the sputtering target up to about 30 to 250 microns of the target surface. In some embodiments, heat treatments are followed by an etching step, such as a chemical etch, to remove or reshape any surface cracking, distortions or gas incorporation introduced by the laser. The focused energy of a laser removes this top damaged area at the top surface. Heat treatment, such as laser treatment, can also be used to melt a thin layer of material at the surface to remove dislocations in the crystal lattice, as has been disclosed herein. This melted material will then quickly resolidify, taking on the crystallographic orientation of the underlying material. In some embodiments where the atom mobility is high enough, these dislocations in the crystal lattice can also anneal out without completely melting the material. FIG. 1 shows a typical flow chart for the steps involved in a heat treatment process where a laser surface treatment process is used. In this figure, a target is fabricated by conventional methods 110, the target surface is fine-machined using a CNC lathe 120, the surface is laser-treated 130, an optional etching step is used to clean the surface 140 followed by a standard clean and package. FIGS. 2-4 show actual targets 210, 310 and 410, respectively, that have been subjected to a heat treatment, such as a laser treatment or laser annealing. Table 1 shows a set of contemplated conditions for laser treatment of sputtering target surfaces. In some embodiments, the laser type is $CO_2$, femtosecond, YAG, Excimer and related lasers. Ultimately, contemplated laser conditions will vary by the type of laser used and the materials of the surface that is treated.

Another contemplated concentrated heat source is an electron beam, which can be used in the place of a laser. For other concentrated heat sources, it is ultimately important for the source to provide heating of the surface of up to about 250 microns and in some embodiments, from about 30 to 250 microns deep. Suitable contemplated methods and devices include electron beam, microwave heating, infrared heating, induction heating or a combination thereof.

As mentioned, the heat-modified surface and/or surface material can then optionally be subjected to a chemical etch which is used to round off the sharp edges of the cracks to prevent arcing, but leaving a network of shallow trenches, or alternating rounded peaks and valleys in the surface of the target. These rounded peaks and valleys act to locally enhance the electrical field during sputtering, and encourage a faster sputter rate of the surface, which enables burn-in to complete more quickly than normal.

Another method of minimizing the surface defects of a sputtering target is to utilize "deplating". In this method, the target surface is "deplated" with a chemically-compatible plating bath. For example, a copper target might be deplated by utilizing a standard copper sulfate plating bath. Plating bath parameters, such as current density, bath chemistry and circulation will affect the uniformity of the deplated surface. FIG. 5 and Table 2 shows several samples—some for comparison purposes and some contemplated. Samples A, B and D were deplated and Sample C was etched.

Some contemplated sputtering targets having reduced burn-in times are described herein that include: a surface material, and a core material, wherein at least one of the surface material or the core material comprises a relatively band-free crystallographic orientation. It should be understood that it may not be necessary to have a machine-finished surface for these targets having a relatively band-free crystallographic orientation, especially since this band-free orientation helps to ensure that the burn-in time is not prolonged by avoiding textures through the depth that sputter at different rates.

The first mechanism addresses surface and near surface distortions, which affect every target in this class, regardless of the PVD tool design, target configuration or PVD process. The second mechanism (band-free orientation) deals with variations in crystallographic orientation below the surface of the target. In this case, bands of grains with strong preferred orientation can cause shifts in deposition rate, as the sputtering process uncovers different bands. Depending on the design of the PVD tool, the target configuration and the particular process that is being utilized. It is possible to simultaneously uncover multiple bands, resulting in a phenomenon that presents itself as an unusually long burn-in time. PVD tools that use magnets that strongly focus the magnetic field in a highly localized region, resulting in a deep erosion groove, are highly susceptible to this mechanism of deposition rate variation.

In some embodiments, it would be desirable to fabricate a texture band-free blank to be used in the production of the final sputtering target. Such a tantalum target blank is described in U.S. Pat. No. 6,331,233 issued to Turner. Another such blank can be produced by utilizing plasma spray, cold spray or a similar spray technique onto a target form or backing plate. In some embodiments, the form or backing plate can be "shape-matched" to mimic the erosion profile in order to minimize material usage. Powder metallurgy may also be used where HIP or vacuum hot press with $TaH_2$ or, in some embodiments, $TiH_2$ powder is applied to the top and bottom of a layer of tantalum powder in a die, such as a graphite die. The $TaH_2$ or $TiH_2$ powder draws oxygen away from the tantalum, thus deoxidizing tantalum and acting as an "oxygen scavenger" for any oxygen that is released from tantalum. One or both titanium layers can be removed later before the tantalum is bond-assembled, or one or both of the titanium layers can be utilized as interlayers to facilitate bonding. In other embodiments, a material, such as copper, can be utilized to planarize tantalum bonding surfaces to simplify diffusion bonding. This layer can be applied via plasma spray, cold spray or another suitable spray technique. The planarizing layer is then lowered into a backing plate fitted with an opening to accept the assembly. The planarization layer is then e-beam welded to the backing plate and the whole assembly is pressed to bond, such as by HIP.

Once the texture band-free target blank is formed, it can be bond-assembled by any suitable methods and then machined to form a defect-free surface, as contemplated and described herein. Targets formed using these texture band-free target blanks show an absence of texture bands and comprise a more uniform crystallographic orientation. These texture band-free target blanks may then be subjected to heat-modification according to the methods disclosed herein.

The phrase "residual surface damage" was defined earlier in the disclosure, but its important to understand contemplated methods of quantitatively determining this damage. In determining the residual surface damage, methods have been developed that include: providing a sputtering target having a surface, wherein the surface comprises a plurality of crystal grains and wherein each crystal grain has a crystal orientation, providing an electron beam, scanning the surface with the electron beam, collecting data from the electron beam scanning, wherein the data provides a local variation in a crystal orientation of each crystal grain; and utilizing the data to determine the thickness of the surface layer and the degree of residual surface damage.

One of the techniques utilized in contemplated methods of determining residual surface damage is Electron Backscatter Diffraction (EBSD), which is a technique which allows crystallographic information to be obtained from samples in the scanning electron microscope (SEM). In EBSD, a stationary electron beam strikes a tilted crystalline sample and the diffracted electrons form a pattern on a fluorescent screen. This pattern is characteristic of the crystal structure and orientation of the sample region from which it was generated. The diffraction pattern can be used to measure the crystal orientation, measure grain boundary misorientations, discriminate between different materials, and provide information about local crystalline perfection. When the beam is scanned in a grid across a polycrystalline sample and the crystal orientation measured at each point, the resulting map will reveal the constituent grain morphology, orientations, and boundaries. This data can also be used to show the preferred crystal orientations (texture) present in the material. A complete and quantitative representation of the sample microstructure can be established with EBSD. (see HTTP://WWW.EBSD.COM/EBSDEXPLAINED.HTM)

One can measure crystal imperfection with various X-ray techniques, however, these techniques are neither straight forward to implement nor to interpret. Additionally, with X-ray a majority of the information comes from a very thin surface layer. The signal decays exponentially with depth. In the case of Ta and the most common Cu K-alpha radiation, 95% of the signal comes from a depth of less than 5 micron. In addition to that, the information gathered by X-ray diffraction is of a macroscopic nature. It is averaged over all the grains illuminated by the beam. With EBSD, one gets grain by grain information of the state of local misorientation. If the crystal imperfections are localized, such as under the machining grooves, it would affect sputtering and it would show up with the EBSD technique.

Methods of producing a sputtering target having a reduced burn-in time are also contemplated comprising: providing a sputtering target having a sputtering surface, wherein the sputtering surface comprises a damage layer, and modifying the sputtering surface by deplating a layer of material via periodic reverse, pulse-plating a layer of material or a combination thereof. An example of a contemplated method is shown in Example 4. In some embodiments, at least one additional layer is applied utilizing electrochemical deposition via DC, pulse, periodic reverse rectification or any combination thereof.

The methods contemplated and disclosed herein for producing sputtering targets having a reduced burn-in time are contemplated to reduce the burn-in time of the sputtering target over a conventional sputtering target made of the same material. In some embodiments, the burn-in time is reduced by at least 10% over a conventional target made of the same material, and in other embodiments, the burn-in time is reduced by at least 25% over a conventional target made of the same material. In some embodiments, the burn-in time is reduced by at least 40% over a conventional target made of the same material, and in other embodiments, the burn-in time is reduced by at least 50% over a conventional target made of the same material. In some embodiments, the burn-in time is reduced by at least 60% over a conventional target made of the same material, and in other embodiments, the burn-in time is reduced by at least 75% over a conventional target made of the same material.

EXAMPLES

Example 1

Tantalum Target Burn-In Reduction Study

As discussed herein, a new sputtering target without a period of burn-in time will produce several defects and inconsistencies in performance and film quality, including inconsistent film resistivity (deposition rate, thickness, etc.), more particles, lower film reflectivity and generally inconsistent target and film performance. These defects and inconsistencies are generally caused by: a) the surface material of the target is not the same as the bulk material, b) techniques used to create the final finished surface can damage the surface of the material, as discussed earlier, including highly dislocated or twinned material, smeared surface material and/or oxidized or contaminated material at the surface.

Reflectivity of a metal surface depends not only on the micro-topography, but also the electrical conductivity of the surface. Polished surfaces produce inferior reflectivity because of surface damage that also decreases electrical resistivity. Micro-machined surfaces, produced by single-point diamond turning for example, resulted in superior reflectivity over polished surfaces. (see *"Performance Characteristics of Single Point Diamond Machined Metal Mirrors for Infrared Laser Applications"*, T. T. Saito and L. B. Simmons, *Applied Optics*, November 1974, Volume 13, Number 11, pages 2647-2650).

Tantalum is not an easy material to machine to a fine finish. Heat builds up easily between the machining tool and tantalum, even with flood cooling. The result is microscopic tear-outs that create a rough-looking surface, even when the overall surface finish is less than about 16 microinches surface roughness (Ra). The conventional approach to dealing with the surface finish is to sand or polish the tantalum surface to improve the visual appearance. And although polishing makes the surface smooth, a damaged layer or residual surface damage develops. This residual surface damage layer, as discussed, extends burn-in time for a sputtering target. FIGS. 6A and 6B show the schematic of an as-machined surface (600) of a sputtering target (605) and of a polished surface (610) of a sputtering target (607) with a residual surface damage layer (620).

The current study compared a standard finish tantalum target (7 Ra, standard polished finish) that was finished with sanding and polishing with two different as-machined target finishes (16 Ra, as-machined to 16 finish, and 27 Ra, as machined to 32 finish). Since burn-in is highly subject to individual customer requirements, film reflectivity was used to determine whether the target was fully burned-in. Low reflectivity indicates the presence of residual oxides and contaminant pockets or layers. In addition, normal reflectivity indicates that the damaged layer has burned off and that the exposed portion of the target comprises an undamaged layer.

FIG. 7 shows a graph with "I-V" curves, where operating current (A) and operating voltage (V) are represented on the graph. The targets with as-machined 16 Ra (Lot 4098273) and 27 Ra (Lot 4125243) show virtually identical I-V curves. The target with polished 7 Ra standard finish (Lot 4126677) operated at a slightly higher voltage, potentially because of the residual resistive damage layer.

FIG. 8 shows a bar graph of tantalum film reflectivity data, specifically reflectivity at 480 nm for each of the three targets mentioned above over 5 kW-hours, 10 kW-hours and 20 kW-hours. The film reflectivity of the standard finish polished target (7 Ra) was initially lower than those of the as-machined targets. The reflectivity of the polished standard target recovered after about 4 times longer burn-in or 20 kW-hours. The as-machined surfaces appear to have less of a residual surface damage layer.

Example 2

EBSD Experimental Procedure and Typical Results

Sample Preparation:

Cross sections of the sputtering target material perpendicular to the surface are prepared in order to be analyzed. It was found to be advantageous to start by making two parallel cuts with a precision saw such as the Struers Accutom. This enables one to mount the sample with adhesive tape to regular SEM mounts while ensuring that the surface of interest stays parallel to the focusing plane of the microscope. Cutting speeds typically vary from 0.005 to 0.02 mm/sec. In most embodiments, the slower speed will be used for the surface that will be analyzed. This reduction in speed minimizes the amount of damage that the cutting process can introduce. The length of the cut is typically 10-25 mm. The sample is then mounted in conductive resin, ground to 4000 grit and then polished to 3 micron. Finally the sample is electro-polished in an 80/20 sulfuric/HF solution.

At this point, the sample is broken out of the resin mount and it is attached with conductive tape to the SEM mount. Alternate preparation techniques forego the two parallel cuts and use the conductive resin mount directly in the SEM. In this case, the geometric features of the conductive resin mount ensure the alignment of the investigated surface in the electron microscope. However, the samples have a tendency towards edge rounding during the polishing process. This results in the sample surface to be lower than the mounting material. This causes the diffracted electron beam from points close to the surface to be intercepted by the mount. This is not a big problem if one is interested in bulk properties. However, it compromises the data from the region of interest for a surface analysis.

The data collection part is basically the same as for any other EBSD study. The sample is tilted to about 70 degree, the diffracted electrons are intercepted by a phosphor screen/detector. A low light camera records the image, the image is enhanced and then processed by a computer to determine the orientation of the crystalline region that is interacting with the electron beam. Since the distribution of crystal orientation within the grains is the important factor, it is advisable to use mapping grid that is a fraction of the expected grain size. Typical tantalum material that has been analyzed has an average grain size of about 50-60 micron, however, many grains will be considerably smaller than that. Grid spacing of 2-5 micron has successfully been used for this material. Data is then collected according to the expected depth of the deformation layer and a width that will depend on the machining groove pattern. Typically 80-100 micron by 2-3 mm.

The data is then analyzed by calculating the average variation of crystalline orientation. Commercial software packages (for example, Channel from HKL Technology) provide map components that do these calculations. Basically, for each point within a grain, the software calculates the angular difference in orientation for this point and its neighboring points (as long as they are in the same grain) and then averages the value. Multiple schemes can be set up that use either only nearest neighbors or nearest and next nearest neighbors or even more points. The exact scheme is not of importance. The more localized version is preferred, as they provide better spatial resolution. The resulting data is then plotted and the burn-in affecting layer is identified by locating the depth at which the data starts deviating from the bulk value.

Example 3

Induction Heating Device and Method

In an annealing setup, a high wattage, heat-producing source, such as a light bulb similar to those used in Rapid Thermal Annealing tools, is used. Induction heating can be conducted to achieve recovery or recrystallization by applied eddy current heating on to thin surface of the conductive materials. These sources are usually placed in an arm/fixture with the target 930 rotating on a turn table-type of arrangement 920 in an atmospheric controlled environment (glove box—910), such as the one shown in FIG. 9. By placing these heat sources 940 near the surface of the target 930, it would be possible to anneal the material damage incurred during previous machining steps. One advantage of these heating processes is the capability of controlling the depth of material needed to be recovery or recrystallization. Secondly, the cycle time is short which will provide high throughput in high volume manufacturing environment.

Example 4

CU Surface Modification Via ECD for Fast Burn-In

The machine damaged layer on the surface of the target may be removed via an electrochemical deposition method. The principle is similar in concept to ECM, but removes material uniformly from a large planar surface rather than imparting specific features. Two important parameters are: the complete removal of the machined damaged layer and uniform copper removal to retain a planar target surface. Surface appearance may be tailored to suit the customer.

A specific example of this embodiment includes the use of high current density reverse plating ("deplating") of the copper target surface utilizing periodic reverse or pulse rectification. A standard copper sulfate plating bath is used with low solution turbulence to minimize flow patterns on the target surface. A 1:1 anode to cathode ratio is utilized to promote uniform Cu removal. Frequent intermediate rinse steps desmut the work surface and maintain uniformity. FIG. 10 illustrates the uniform removal of approximately 40 microns of copper across the target diameter. The resultant surface exhibits a "grainy" appearance reflective of the exposed copper microstructure (see FIG. 11), but still retains a surface roughness of approximately 40 microinches ($R_a$). In some embodiments, the surface roughness may be less than 100 microinches. In other embodiments, the surface roughness may be less than 75 microinches. In yet other embodiments, the surface roughness may be less than 50 microinches. And in other embodiments, the surface roughness may be less than 25 microinches. The removal depth, surface appearance, and planar uniformity are all conditions that may be altered via process conditions known to those skilled in the arts of electrochemical deposition.

In some contemplated embodiments, additional plating of a material, such as copper, may be used to smooth out the surface after removal of the machine damaged layer, which may reduce or eliminate the possibility of arcing from excessive roughness that may arise from a high current density material removal process. At the very least, this additional step will enhance the appearance of the target. In some embodiments, utilization of the proper process parameters Will level the surface to some extent. At the very least, this additional step will enhance the appearance of the target. In some embodiments, utilization of the proper process parameters will level the surface to some extent.

Example 5

TA Surface Modification Via Laser Treatment (Heat Treatment) for Fast Burn-In

In this example the process begins by choosing a bulk target fabrication process, such as that disclosed in U.S. Pat. No. 6,331,233, that produces a target that is uniform in texture throughout its thickness and is free of distinct strong texture bands. In this example, it is important to choose a target that begins with a uniform texture throughout its thickness so that sputter burn-in times are not extended by the presence of a non-uniform texture band lying close to the target surface.

The process continues by machining the surface of the target smooth with a CNC lathe or mill so that the surface roughness is less than 65 microinches Ra, and preferably below 30 microinches Ra, with highly deformed and slightly misoriented depth, as measured by EBSD, where the misorientation extends no deeper than 120 microns, preferably 70 microns or below. This machining step is detailed in U.S. application Ser. No. 11/595,658 that was filed on Nov. 9, 2006.

The surface is then laser treated to melt, but not ablate the surface of the target, then rapidly solidify the melted material, which will solidify with the same crystallographic orientation as the underlying grains. Note that no material is removed from the target surface in this step. The laser-treated surface will be free of highly deformed material, and will have very slightly misoriented grains, preferably less than one, but no more than 2 grain layers deep into the surface. FIG. 12 shows EBSD misoriention plots (edge sample, mid-radial sample and center sample) that show the absence of sub-surface damage. This process is quite different from those described in the references from the background section, because this process is melting at least part of the surface material and then allowing it to rapidly solidify, whereas the processes described to date only anneal the surface, which allows atoms in the crystal lattice to move to a lower energy state.

The laser-treated surface may also have a plurality of fine micro-cracks, resulting from the thermal shock of rapidly melting and rapidly cooling the surface material. These cracks will extend 10 to 50 microns down into the surface of the target. FIGS. 13A and 13B show the appearance of these micro-cracks. FIG. 13A shows a laser treated surface at 200× magnification using an optical microscope. Note that there are laser trace marks and fine surface cracks. FIG. 13B shows a laser treated surface using SEM in backscattered mode. The fine surface cracks are shown.

The laser-treated surface may then be subjected to a chemical etch, which is used to round off the sharp edges of the cracks to prevent arcing, but leaving a network of shallow trenches, alternating rounded peaks and valleys in the surface of the target or combinations thereof. These rounded peaks and valleys act to locally enhance the electrical field during sputtering, and encourage a faster sputter rate of the surface, which enables burn-in to complete more quickly than normal. FIG. 14 shows the appearance of this surface. In this Figure, the surface has been laser-treated and then etched using a 30% HNO$_3$/15% HF solution for 20 minutes, where about 13 micrometers of Ta was removed. As one can see, the cracks have widened to grooves.

The surface produced by the laser treatment disclosed herein has a unique appearance. Under magnification (shown in FIG. 14), it will become apparent that the surface consists of a series of parallel arcs. The arcs define the edges of the laser beam that was used to locally melt the surface of the material. The spacing between the arcs is determined by the frequency of the laser pulse and the rate at which the laser is rastered across the target surface. The leading edge of the arc shows the direction of the beam travel (downward in the case of the arc series in the center of FIG. 14). Parallel rows of these arc traces will be formed as the laser is rastered back and forth across the target (see the pattern in the center & to the left of FIG. 14). Alternatively, the arc traces could be rastered in a concentric circle pattern to cover the entire surface of the target. The laser pulses overlap each other and the raster lines of the laser beam overlap each other to ensure that the entire target surface is melted to remove all traces of subsurface damage.

The target made by the above method should have at least one of the following characteristics:

1. Have a uniform crystallographic orientation throughout its thickness so that burn-in times will not be extended by sputtering un-expectedly into regions (bands) of strong texture that sputter at a different rate from the surrounding regions.
2. Have a surface with a network of rounded peaks and valleys that locally enhance the electric field during sputtering and encourage the surface to sputter at a faster rate than the bulk, in order to accelerate burn-in time.
3. Have a subsurface damage layer as measured by EBSD misorientation less than one grain layer deep, and no more than five grain layers deep.

Specific embodiments and applications of methods of surface modification of sputtering targets and related apparatus have been disclosed. It should be apparent, however, to those skilled in the art that many more modifications besides those already described are possible without departing from the inventive concepts herein. The inventive subject matter, therefore, is not to be restricted except in the spirit of the disclosure and claims herein. Moreover, in interpreting the disclosure and claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

TABLE 1

| PARAMETER | RANGE | PREFERRED |
|---|---|---|
| POWER | 400 TO 800 WATTS | 800 WATTS |
| FREQUENCY | 100 TO 1000 Hz | 1000 Hz |
| FEED RATE | 20 TO 185 in/min. | 100 in/min. |
| STANDOFF | 0.025" TO 0.100" | 0.025" |

TABLE 2

| SAMPLE | TREATMENT | AGITATION | ETCH DEPTH (MICRONS) | TIME (MIN) | MEAN ROUGHNESS Ra | COMMENTS |
|---|---|---|---|---|---|---|
| A | DEPLATE 75 ASF | YES | 48 | 25 | 56 | PERIODIC LIGHT SCRUB - GRAIN STRUCTURE REVEALED, EDGE LESS ETCHED |
| B | DEPLATE 75 ASF | YES | 37 | 18 | 52 | NO SCRUB - GRAIN STRUCTURE REVEALED, PERIMETER LESS ETCHED |
| C | ETCH 30% HNO$_3$ | NO | 34 | 10 | 47 | VERY UNIFORM ETCH, GRAINS REVEALED |
| D | DEPLATE 50 ASF | NO | 34 | 20 | 51 | MOSTLY FINE MATTE FINISH WITH FEW DEEPER POCKETS |
| E | DIAMOND FINISH | | | | 15 | BRIGHT, MIRROR FINISH |

We claim:

1. A method of producing a sputtering target comprising a sputtering surface and an underlying core material, the sputtering surface and the underlying core material having the same composition, the method comprising:

providing a sputtering target made of a solid metal or metal alloy that is uniform in texture throughout its thickness;

machining a sputtering surface of the sputtering target with formation of a residual surface damage layer;

preparing the sputtering target for use in a sputtering chamber by heat-modifying the sputtering surface of the sputtering target using a laser to melt and resolidify only the material of the sputtering surface over the underlying core material such that a crystal lattice of the residual surface damage layer of the sputtering surface adopts a crystallographic orientation of the underlying core material, and a surface morphology including a pattern of raster lines is imparted to the resolidified sputtering surface; and packaging the sputtering target with the resolidified sputtering surface having the surface morphology including the pattern of raster lines.

2. The method of claim 1, wherein heat-modifying the sputtering surface does not remove material from the sputtering surface.

3. The method of claim 1, wherein the sputtering surface includes a depth of sputter material and wherein heat-modifying comprises melting a least a portion of the depth of the sputter material across the entire sputtering surface.

4. The method of claim 3, wherein the heat-modification is applied up to about 250 microns deep in the sputter material.

5. A method of producing a sputtering target that includes a sputter material surface disposed over an underlying sputter material, the surface and the underlying sputter material having the same composition, the method comprising:
   providing a sputtering target made of a solid metal or metal alloy that is uniform in texture throughout its thickness;
   machining a sputtering surface of the sputtering target with formation of a residual surface damage layer;
   preparing a sputtering target for use in the sputtering chamber by heat-modifying the sputter material surface of the sputtering target to melt only the sputter material surface, including the residual surface damage layer, without melting the underlying sputter material in a single step and without removal of the sputter material from the surface of the sputtering target; and
   resolidifying the melted sputter material in order to adopt a crystallographic orientation of an underlying material.

6. The method of claim 5, wherein heat-modifying the sputter material includes melting the sputter material across the entire surface of the sputtering target.

7. The method of claim 5, wherein heat-modifying comprises induction heating, laser treatment, electron beam treatment, or treatment with a concentrated heat source.

8. The method of claim 5, wherein the heat-modification is applied up to about 250 microns deep in the sputter material.

9. The method of claim 5, wherein heat-modifying comprises laser treatment.

10. A method of producing a sputtering target, the method comprising:
   providing a sputtering target made of a solid metal or metal alloy that is uniform in texture throughout its thickness;
   machining a sputtering surface of the sputtering target with formation of a residual surface damage layer;
   preparing the sputtering target for use in a sputtering chamber by heat-modifying the sputtering target having a depth of an original sputter material at a surface, wherein the heat-modifying melts at least a portion of the depth of the original sputter material, including the residual surface damage layer, without melting an underlying sputter material and wherein the depth of the original sputter material and the underlying sputter material have the same composition; and
   producing a heat-modified sputter material by resolidifying only the melted original sputter material so that the heat-modified sputter material and residual surface damage layer adopts a crystallographic orientation of the underlying material with the heat-modifying and resolidifying imparting a surface morphology including a pattern of raster lines to the sputter surface; and
   packaging the sputtering target having the surface morphology including the pattern of raster lines.

11. The method of claim 10, wherein the heat-modification is applied up to about 250 microns deep in the sputter material.

12. The method of claim 10, wherein heat-modification comprises laser treatment.

13. The method of claim 1, wherein the sputtering target comprises one of copper and a copper alloy.

14. The method of claim 1, wherein the sputtering target comprises one of tantalum and a tantalum alloy.

15. The method of claim 5, wherein the sputtering target comprises one of copper and a copper alloy.

16. The method of claim 5, wherein the sputtering target comprises one of tantalum and a tantalum alloy.

17. The method of claim 10, wherein the sputtering target comprises one of copper and a copper alloy.

18. The method of claim 10, wherein the sputtering target comprises one of tantalum and a tantalum alloy.

19. The method of claim 1, wherein the sputtering target comprises one of titanium and a titanium alloy.

20. The method of claim 5, wherein the sputtering target comprises one of titanium and a titanium alloy.

21. The method of claim 10, wherein the sputtering target comprises one of titanium and a titanium alloy.

* * * * *